United States Patent
Lee et al.

(10) Patent No.: US 8,421,530 B2
(45) Date of Patent: Apr. 16, 2013

(54) FILTER CIRCUIT, INTEGRATED CIRCUIT INCLUDING THE SAME, AND SIGNAL FILTERING METHOD

(75) Inventors: Ji-Wang Lee, Gyeonggi-do (KR); Shin-Deok Kang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 53 days.

(21) Appl. No.: 13/078,339

(22) Filed: Apr. 1, 2011

(65) Prior Publication Data

US 2012/0154030 A1 Jun. 21, 2012

(30) Foreign Application Priority Data

Dec. 16, 2010 (KR) .................. 10-2010-0128922

(51) Int. Cl.
*H03K 5/00* (2006.01)
(52) U.S. Cl.
USPC ........................................ 327/553; 327/552
(58) Field of Classification Search .................. 327/336, 327/337, 551–559
See application file for complete search history.

(56) References Cited

U.S. PATENT DOCUMENTS

| | | | | |
|---|---|---|---|---|
| 5,047,841 A | * | 9/1991 | Robinson | 348/610 |
| 5,925,868 A | * | 7/1999 | Arends et al. | 235/454 |
| 6,356,142 B1 | * | 3/2002 | Mittel | 327/553 |

FOREIGN PATENT DOCUMENTS

| | | |
|---|---|---|
| KR | 1020000004654 | 1/2000 |
| KR | 1020030051976 | 6/2003 |
| KR | 1020060005843 | 1/2006 |
| KR | 1020100036601 | 4/2010 |

OTHER PUBLICATIONS

Office Action issued by the Korean Intellectual Property Office on Jan. 6, 2012.
Notice of Allowance issued by the Korean Intellectual Property Office on Jun. 28, 2012.

* cited by examiner

*Primary Examiner* — Dinh T. Le
(74) *Attorney, Agent, or Firm* — IP & T Group LLP

(57) ABSTRACT

A filter circuit includes a filtering unit configured to filter an input signal and generate an output signal, and a weight generation unit configured to monitor a variation of the output signal and generate weight information based on the monitored variation.

16 Claims, 4 Drawing Sheets

FILTER CIRCUIT, INTEGRATED CIRCUIT INCLUDING THE SAME, AND SIGNAL FILTERING METHOD

CROSS-REFERENCE TO RELATED APPLICATIONS

The present application claims priority of Korean Patent Application No. 10-2010-0128922, filed on Dec. 16, 2010, which is incorporated herein by reference in its entirety.

BACKGROUND OF THE INVENTION

Exemplary embodiments of the present invention relate to a filter circuit which is applicable to integrated circuits using a filter.

Digital systems may use digital filters, where a low pass filter is frequently used. A low pass filter is used to output a low frequency signal, and may be designed for signal processing for a specific frequency band. In addition, a low pass filter is used to improve stability in terms of control and to reduce jitter.

FIG. 1 is a configuration diagram of a conventional digital phase locked loop (PLL) that includes a filter.

Referring to FIG. 1, the digital PLL includes a phase detector 110, a filter 120, an oscillator 130, and a divider 140. The filter 120 is used to filter an up/down signal UP/DN outputted from the phase detector 110 to thereby remove jitter or noise components from the up/down signal UP/DN, where the phase detector 110 may decrease a frequency of the up/down signal UP/DN. Here, due to limitations in the processing speed of the oscillator 130 and a delay of the feedback loop including the divider 140, the high frequency up/down signal UP/DN is to be converted into a low frequency signal. Without the filter 120, serious jitter may occur at the output of the oscillator 130, or an output signal CLK_OUT of the digital PLL may diverge.

Here, the filter 120 reduces jitter and noise and ensures a stable operation of the PLL. However, excessive filtering by the filter 120 reduces the operating speed of the PLL and increases a locking time of the PLL.

Thus, while the filter 120 ensures a stable operation of a circuit (a PLL or other circuits) to which the filter is applied, it also reduces the operating speed of the circuit to which the filter is applied.

SUMMARY OF THE INVENTION

An embodiment of the present invention is directed to improvement in an operating speed of a circuit to which a filter is applied.

In accordance with an embodiment of the present invention, a filter circuit includes: a filtering unit configured to filter an input signal and generate an output signal; and a weight generation unit configured to monitor a variation of the output signal and generate weight information based on the monitored variation.

In accordance with another embodiment of the present invention, an integrated circuit includes: a filtering unit configured to filter an input signal and generate an output signal; a weight generation unit configured to monitor the output signal and generate weight information in response to the monitoring result; and an internal circuit configured to operate in response to the output signal and the weight information.

In accordance with yet another embodiment of the present invention, a signal filtering method includes: filtering an input signal to generate an output signal; storing the output signal; and determining whether to assign a weight to the output signal by comparing the stored output signal with a current output signal.

In accordance with still another embodiment of the present invention, a signal filtering method includes: filtering an input signal to generate an output signal; delaying the output signal; and determining whether to assign a weight to the output signal by comparing the delayed output signal with a current output signal.

DESCRIPTION OF SPECIFIC EMBODIMENTS

Figure 1:
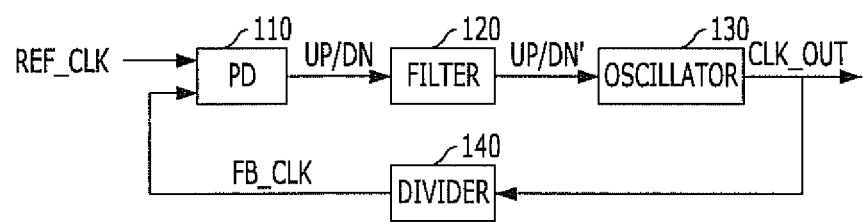
FIG. 1 is a configuration diagram of a conventional digital PLL that includes a filter.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
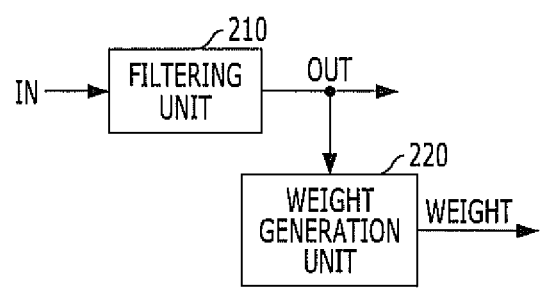
FIG. 2 is a configuration diagram of a filter circuit in accordance with an embodiment of the present invention.

FIG. 2 is a configuration diagram of a filter circuit in accordance with an embodiment of the present invention.

Referring to FIG. 2, the filter circuit includes a filtering unit 210 and a weight generation unit 220. The filter unit 210 filters an input signal IN and outputs an output signal OUT. The weight generation unit 220 monitors a variation of the output signal OUT and generates weight information WEIGHT.

The weight generation unit 220 generates the weight information WEIGHT by determining whether or not a current value of the output signal OUT is identical to a previous value of the output signal OUT. When the current value of the output signal OUT is identical to the previous value of the output signal OUT, the weight generation unit 220 determines that the current output signal OUT is likely to maintain the current pattern. Thus, a weight is assigned to the output signal OUT. For example, when the output signal OUT has values of "H" and "H" successively, it is more likely that the output signal OUT will have a value of "H" afterwards. Therefore, weight information WEIGHT is activated to assign the weight to the output signal OUT when the output signal OUT has values of "H" and "H" successively. When the output signal OUT has values of "L" and "L" successively, it is more likely that the output signal OUT will have a value of "L" afterwards. Therefore, the weight information WEIGHT is again activated to assign the weight to the output signal OUT.

The weight information WEIGHT determines a variation range of an operation of a circuit (not shown) provided at the rear end of the filtering unit 210. According to an example, if the output signal OUT of the filtering unit 210 is an up/down signal and the circuit provided at the rear end of the filtering unit 210 is a counter, the counter increments or decrements a code value by 1 in response to the up/down signal when the weight information WEIGHT is deactivated. On the other hand, the counter increments or decrements a code value by 2 when the weight information WEIGHT is activated.

The filtering unit 210 may be any reasonably suitable filter. Since various filter designing methods are well known to those skilled in the art, a further detailed description thereof is omitted.

Figure 3:
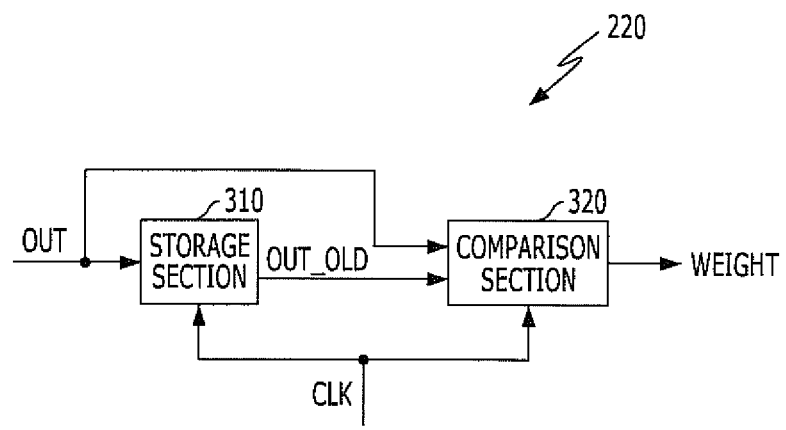
FIG. 3 is a configuration diagram of a weight generation unit of FIG. 2 in accordance with a first embodiment of the present invention.

FIG. 3 is a configuration diagram of the weight generation unit 220 of FIG. 2 in accordance with a first embodiment of the present invention.

Referring to FIG. 3, the weight generation unit 220 may include a storage section 310 and a comparison section 320.

The storage section 310 stores the output signal OUT of the filtering unit 210. An output OUT of a previous period is stored in the storage section 310 and is output as an output signal OUT_OLD in the current period of the output signal OUT. The storage section 310 operates in synchronization with a periodic signal CLK. The storage section 310 receives and stores the output signal OUT in synchronization with a rising edge of the periodic signal CLK (for example, by storing data detected at the rising edge of the periodic clock CLK). The periodic signal CLK may have the same frequency as that of the output signal OUT.

The comparison section 320 compares the output signal OUT_OLD stored in the storage section 310 (the previous output signal OUT) with the output signal OUT outputted from the filtering unit 210 (the current output signal OUT), and generates the weight information WEIGHT according to the comparison result. When the value of the output signal OUT_OLD stored in the storage section 310 is identical to the value of the output signal OUT outputted from the filtering unit 210, the weight information WEIGHT is activated (that is, a weight is assigned to the output signal OUT). On the other hand, when the two values are different from each other, the weight information WEIGHT is deactivated (that is, the weight is not assigned to the output signal OUT). The comparison section 320 may operate in synchronization with the periodic signal CLK. The comparison section 320 compares the output signal OUT_OLD with the output signal OUT in synchronization with a falling edge of the periodic signal CLK (for example, by performing the comparison of the two signals at the falling edge of the periodic signal CLK).

Although an embodiment where the storage section 310 operates in synchronization with the rising edge of the periodic signal CLK, the comparison section 320 operates in synchronization with the falling edge of the periodic signal CLK, and a stable operation is obtained has been described, other embodiments of the present invention can also be used. For example, both of the storage section 310 and the comparison section 320 may operate in synchronization with the same edge of the periodic signal CLK.

Figure 4:
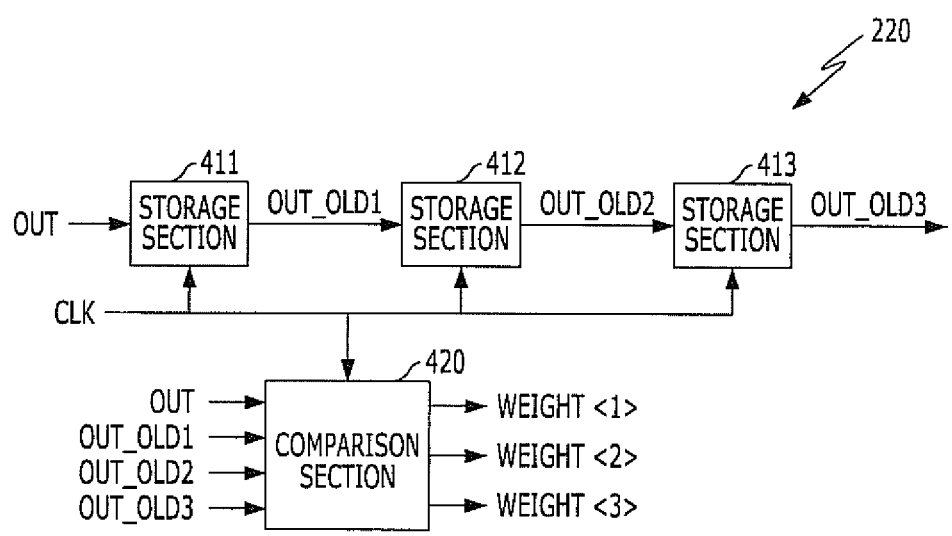
FIG. 4 is a configuration diagram of a weight generation unit of FIG. 2 in accordance with a second embodiment of the present invention.

FIG. 4 is a configuration diagram of the weight generation unit 220 of FIG. 2 in accordance with a second embodiment of the present invention.

Referring to FIG. 4, the weight generation unit 220 includes a plurality of storage sections 411, 412 and 413 and a comparison section 420.

The plurality of storage sections 411, 412 and 413 are connected in series to sequentially shift and store the output signal OUT of the filtering unit 210 in response to a periodic signal CLK. If the output signal OUT is stored in such a manner, an output signal OUT of a period that is prior to the current period of the output signal OUT by one period of the output signal OUT is output as the output signal OUT_OLD1 of the storage section 411 during the current period of the output signal OUT, an output signal OUT of a period that is prior to the current period of the output signal OUT by two periods of the output signal OUT is output as the output signal OUT_OLD2 of the storage section 412 during the current period of the output signal OUT, and an output signal OUT of a period that is prior to the current period of the output signal OUT by three periods of the output signal OUT is output as the output signal OUT_OLD3 of the storage section 413 during the current period of the output signal OUT after the output signals OUT-OUT_OLD2 are stored in the storage sections 411-413, respectively.

The comparison section 420 generates the weight information WEIGHT<1:3> by comparing the output signals OUT_OLD1, OUT_OLD2 and OUT_OLD3 stored in the plurality of storage sections 411, 412 and 413 with the output signal OUT of the filtering unit 210. The weight information WEIGHT<1:3> includes three signals. The signal WEIGHT<1> is activated when the output signal OUT is identical to the output signal OUT_OLD1, and the signal WEIGHT<2> is activated when the output signal OUT is identical to the output signal OUT_OLD2. Also, the signal WEIGHT<3> is activated when the output signal OUT is identical to the output signal OUT_OLD3. Increase in the number of the signals activated among the signals constituting the weight information WEIGHT<1:3> means that more weight is assigned to the output signal OUT. For example, assuming that the weight is 2 when only the signal WEIGHT<1> is activated, the weight becomes 3 when the signals WEIGHT<1:2> are activated, and the weight becomes 4 when the signals WEIGHT<1:3> are all activated.

Figure 5:
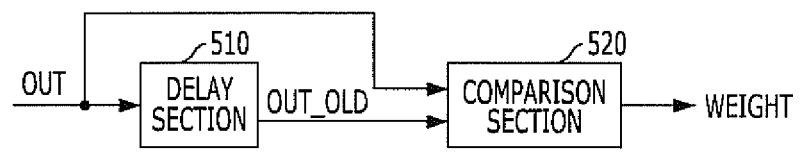
FIG. 5 is a configuration diagram of a weight generation unit of FIG. 2 in accordance with a third embodiment of the present invention.

FIG. 5 is a configuration diagram of the weight generation unit 220 of FIG. 2 in accordance with a third embodiment of the present invention.

Referring to FIG. 5, the weight generation unit 220 may include a delay section 510 and a comparison section 520.

The delay section 510 delays the output signal OUT of the filtering unit 210. By the time that the output signal OUT is delayed by the delay section 510 and is outputted from the delay section 510, it is a previous output signal OUT_OLD with respect to a current period of the output signal OUT. Here, the delay of the delay section 510 according to an example may be set to equal the period of the output signal OUT outputted from the filtering unit 210.

The comparison section 520 generates the weight information WEIGHT by comparing the output signal OUT_OLD delayed by the delay section 510 with the output signal OUT outputted from the filtering unit 210.

Here, the weight generation unit 220 of FIG. 5 is the same as the FIG. 3 circuit except that the storage section 310 of FIG. 3 is replaced by the delay section 510. Similarly, another exemplary embodiment of the weight generation unit 220 may be formed by replacing the plurality of storage sections of FIG. 4 with the delay sections, respectively.

Figure 6:
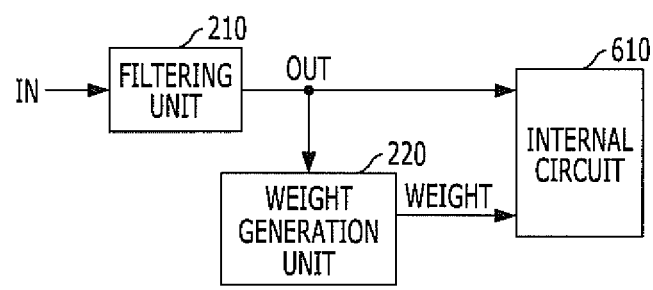
FIG. 6 is a configuration diagram of an integrated circuit for which the filter circuit of FIG. 2 is used.

FIG. 6 is a configuration diagram of an integrated circuit to which the filter circuit of FIG. 2 is applied.

Referring to FIG. 6, the integrated circuit includes the filtering unit 210, the weight generation unit 220, and an internal circuit 610.

An integrated circuit may be any reasonably suitable circuit for which the filter circuit of FIG. 2 may be used. For example, the integrated circuit may include a PLL, a delay locked loop (DLL), and a clock data recovery (CDR) circuit for each of which the filter circuit may be used.

The internal circuit 610 may be any reasonably suitable internal circuit provided inside the integrated circuit and may operate in synchronization with the output signal OUT of the filtering unit 210. The internal circuit 610 changes its operation in a first direction or a second direction according to the output signal OUT. More specifically, the internal circuit 610 may adjust the variation range of its operation according to the weight information WEIGHT.

For example, if the internal circuit 610 is a delay circuit, the internal circuit 610 may increment or decrement a delay value by 1 in response to the output signal OUT when the weight information WEIGHT is deactivated. On the other hand, the internal circuit 610 may increment or decrement a delay value by 2 in response to the output signal OUT when the weight information WEIGHT is activated. If the internal circuit 610 is a counter, the internal circuit 610 may increment or decrement a code value by 1 in response to the output signal OUT when the weight information WEIGHT is deactivated. On the other hand, the internal circuit 610 may increment or decrement a code value by 2 in response to the output signal OUT when the weight information WEIGHT is activated. If the internal circuit 610 is an oscillator, the internal circuit 610 may increment or decrement a frequency of the periodic output signal by 10 MHz in response to the output signal OUT when the weight information WEIGHT is deactivated. On the other hand, the internal circuit 610 may increment or decrement the frequency of the periodic output signal by 20 MHz in response to the output signal OUT when the weight information WEIGHT is activated.

Figure 7:
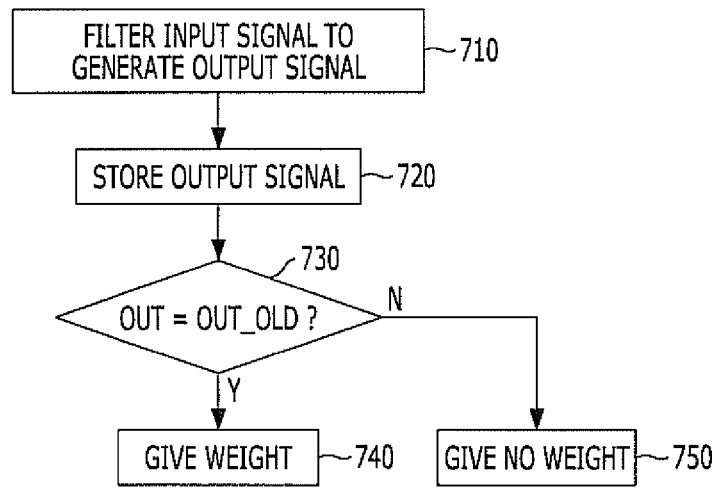
FIGS. 7 and 8 are flowcharts illustrating signal filtering methods in accordance with embodiments of the present invention.
Figure 8:
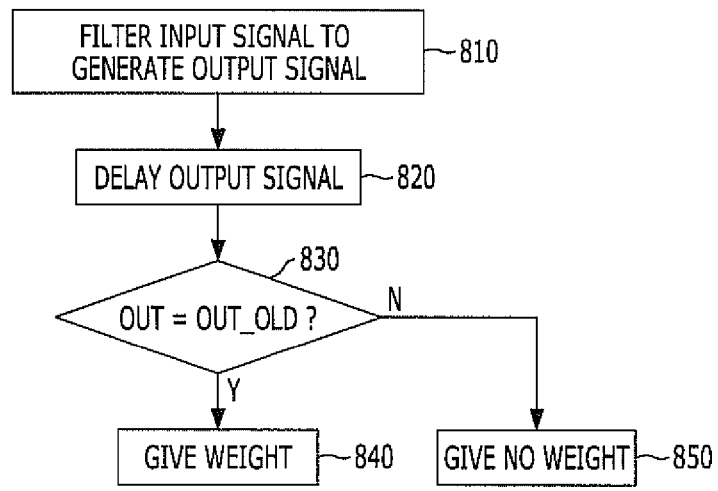

FIGS. 7 and 8 are flowcharts illustrating signal filtering methods in accordance with embodiments of the present invention.

Referring to FIG. 7, an input signal IN (shown in FIG. 6) is filtered to generate an output signal OUT at step 710. The output signal OUT (shown in FIG. 6) is stored at step 720. The stored output signal OUT_OLD (the previous output signal, for example, output from the storage section 310 in FIG. 3) is compared with the current output signal OUT at step 730. When the value of the output signal OUT_OLD is identical to the value of the output signal OUT, a weight is not assigned to the output signal OUT at step 740; otherwise, a weight is not assigned to the output signal OUT at step 750.

Referring to FIG. 8, an input signal IN (shown in FIG. 6) is filtered to generate an output signal OUT (shown in FIG. 6) at step 810. The output signal OUT is delayed at step 820. The delayed output signal OUT_OLD (the previous output signal, for example, output from the storage section 510 in FIG. 5) is compared with the current output signal OUT at step 830. When the value of the delayed output signal OUT_OLD is identical to the value of the output signal OUT, a weight is assigned to the output signal OUT at step 840; otherwise, the weight is not assigned to the output signal OUT at step 850.

The steps of FIGS. 7 and 8 can be repeated in updating the output signal.

In accordance with exemplary embodiments of the present invention, the output signal of the filter is monitored and a weight is assigned according to the output signal of the filter. Therefore, the operating speed of the circuit provided at the rear end of the filter circuit can be increased by the weight.

While the present invention has been described with respect to the specific embodiments, it will be apparent to those skilled in the art that various changes and modifications may be made without departing from the spirit and scope of the invention as defined in the following claims.

In particular, although the foregoing embodiments have been described on the assumption that the filtering unit 210 is provided with a low pass filter, the present invention can be equally applied to a case in which the filtering unit 210 is provided with a high pass filter. In the case in which the filtering unit 210 is provided with a high pass filter, a weight is assigned when the current output value OUT of the filtering unit 210 is different from the previous output value OUT_OLD thereof.

What is claimed is:

1. A filter circuit comprising:
 a filtering unit configured to filter an input signal and generate the filtered input signal as an output signal; and
 a weight generation unit configured to receive the output signal, monitor a variation of the output signal and generate weight information based on the monitored variation,
 wherein the weight information determines a variation range of an operation of a circuit provided at the end of the filtering unit.

2. The filter circuit of claim 1, wherein the weight generation circuit is configured to generate the weight information by determining whether a current output signal of the filtering unit is identical to a previous output signal thereof.

3. The filter circuit of claim 1, wherein the weight generation unit comprises:
 a storage section configured to store the output signal of the filtering unit; and
 a comparison section configured to generate the weight information by comparing an output signal of the storage section with the output signal outputted from the filtering unit.

4. The filter circuit of claim 3, wherein the storage section is configured to periodically store the output signal of the filtering unit in response to a periodic signal, wherein the periodic signal is a signal having the same frequency as the output signal.

5. The filter circuit of claim 1, wherein the weight generation unit comprises:
 a plurality of storage sections configured to sequentially shift and store the output signal of the filtering unit in response to a periodic signal; and
 a comparison section configured to generate the weight information by comparing output signals of the plurality of storage sections with the output signal of the filtering unit.

6. The filter circuit of claim 1, wherein the weight generation unit comprises:
 a delay section configured to delay the output signal of the filtering unit; and
 a comparison section configured to generate the weight information by comparing an output signal of the delay section with the output signal of the filtering unit.

7. The filter circuit of claim 1, wherein the filtering unit comprises a digital low pass filter.

8. The filter circuit of claim 1, wherein the weight information includes a plurality of signals and is configured to activate a first one of the plurality of signals in response to determining that a current output signal of the filtering unit is identical to a previous output signal of the filtering unit and activate a second one of the plurality of signals in response to determining that the current output signal of the filtering unit is identical to a second previous output signal.

9. An integrated circuit comprising:
a filtering unit configured to filter an input signal and generate the filtered input signal as an output signal;
a weight generation unit configured to receive the output signal, monitor the output signal and generate weight information in response to the monitoring result; and
an internal circuit configured to operate in response to the output signal of the filtering unit and the weight information,
wherein the weight information determines a variation range of an operation of the internal circuit provided at the end of the filtering unit.

10. The integrated circuit of claim 9, wherein the internal circuit is configured to change the variation range of the operation thereof in a first direction or a second direction in response to the output signal.

11. The integrated circuit of claim 9, wherein the internal circuit is configured to change the variation range of the operation thereof in response to the output signal.

12. The integrated circuit of claim 11, wherein the internal circuit is configured to increment or decrement a code value by a first value in response to a deactivated state of the weight information and increment or decrement the code value by a second value greater than the first value in response to an activated state of the weight information if the internal circuit is a counter, and wherein the code value is a counting amount of the counter.

13. A signal filtering method comprising:
filtering an input signal to generate an output signal;
storing the output signal; and
determining weight information of the output signal by comparing the stored output signal with a current output signal,
the weight information determines a variation range of an operation of a circuit provided at the end of a filtering unit.

14. The signal filtering method of claim 13, wherein the storing of the output signal is performed in synchronization with a rising edge of a periodic signal and the determining the weight information of the output signal is performed in synchronization with a falling edge of the periodic signal, wherein the periodic signal is a signal having the same frequency as the output signal.

15. The signal filtering method of claim 13, wherein the storing of the output signal, further comprising:
delaying the output signal.

16. The signal filtering method of claim 15,
wherein the weight information includes a plurality of signals, a first one of the plurality of signals is activated in response to determining that a current output signal of the filtering unit is identical to a previous output signal of the filtering unit, and a second one of the plurality of signals is activated in response to determining that the current output signal of the filtering unit is identical to a second previous output signal.

* * * * *